United States Patent
Kim et al.

(10) Patent No.: US 7,015,099 B2
(45) Date of Patent: Mar. 21, 2006

(54) METHOD OF MANUFACTURING A FLASH MEMORY CELL CAPABLE OF INCREASING A COUPLING RATIO

(75) Inventors: Jum Soo Kim, Kyungki-Do (KR); Sung Mun Jung, Kyungki-Do (KR); Jung Ryul Ahn, Kyungki-Do (KR); Young Ki Shin, Kyungki-Do (KR); Young Bok Lee, Kyungki-Do (KR)

(73) Assignee: Hynix Semiconductor, Inc., Kyungki-do (KR)

( * ) Notice: Subject to any disclaimer, the term of this patent is extended or adjusted under 35 U.S.C. 154(b) by 0 days.

(21) Appl. No.: 11/004,301

(22) Filed: Dec. 3, 2004

(65) Prior Publication Data

US 2005/0101089 A1    May 12, 2005

Related U.S. Application Data

(62) Division of application No. 10/310,746, filed on Dec. 5, 2002, now Pat. No. 6,844,231.

(30) Foreign Application Priority Data

Dec. 22, 2001   (KR)   ................... 2001-83493

(51) Int. Cl.
  *H01L 21/336*   (2006.01)
(52) U.S. Cl. .................... 438/257; 438/266
(58) Field of Classification Search ........ 438/257, 438/266
  See application file for complete search history.

(56) References Cited

U.S. PATENT DOCUMENTS

| 6,057,580 | A | 5/2000 | Watanabe et al. |
| 6,222,225 | B1 | 4/2001 | Nakamura et al. |
| 6,376,877 | B1 | 4/2002 | Yu et al. |
| 6,391,722 | B1 | 5/2002 | Koh |
| 6,417,047 | B1 | 7/2002 | Isobe |
| 6,448,606 | B1 | 9/2002 | Yu et al. |
| 6,620,681 | B1 | 9/2003 | Kim et al. |
| 6,878,588 | B1 * | 4/2005 | Dong et al. ............. 438/257 |
| 2002/0068398 | A1 | 6/2002 | Dong et al. |
| 2003/0119256 | A1 | 6/2003 | Dong et al. |
| 2003/0119259 | A1 | 6/2003 | Jeong et al. |
| 2003/0119263 | A1 | 6/2003 | Lee et al. |

FOREIGN PATENT DOCUMENTS

| KR | 2003-0053314 | 6/2003 |
| KR | 2003-0053315 | 6/2003 |

\* cited by examiner

*Primary Examiner*—Jack Chen
(74) *Attorney, Agent, or Firm*—Marshall, Gerstein & Borun LLP

(57) ABSTRACT

A method of manufacturing a flash memory cell. The method includes controlling a wall sacrificial oxidization process, a wall oxidization process and a cleaning process of a trench insulating film that are performed before/after a process of forming the trench insulating film for burying a trench to etch the trench insulating film to a desired space. Therefore, it is possible to secure the coupling ratio of a floating gate by maximum and implement a device of a smaller size.

22 Claims, 6 Drawing Sheets

METHOD OF MANUFACTURING A FLASH MEMORY CELL CAPABLE OF INCREASING A COUPLING RATIO

CROSS-REFERENCE TO RELATED APPLICATION

This is a divisional of application Ser. No. 10/310,746, filed on Dec. 5, 2002, now U.S. Pat. No. 6,844,231, which is incorporated herein by reference.

BACKGROUND

1. Technical Field

Methods of manufacturing flash memory cells, and more particularly to, methods of forming a self-aligned floating gate capable of increasing the coupling ratio of flash memory cells are disclosed.

2. Description of the Related Art

Generally, a flash memory cell is implemented using a shallow trench isolation (STI) process as a device isolation process. During the process of isolating a floating gate using mask patterning, wafer uniformity is very poor depending on variation in a mask critical dimension (CD). It is thus difficult to implement a uniform floating gate. Further, there are problems such as program and erase fail of the memory cell, or the like, depending on variation in the coupling ratio.

In addition, in a higher-integrated design, when a space of below 0.13 μm is implemented, the masking process is difficult. Thus, a process of manufacturing the flash memory cell serving as an important factor in implementing a uniform floating gate becomes further difficult. Also, if the floating gate is not uniformly formed, difference in the coupling ratio becomes severe. Thus, upon program and erase of the memory cell, there is a possibility that the memory cell may be over erased. This adversely affects a device characteristic. Also, the yield of the product is lowered and the cost is increased, due to increase in the mask process.

SUMMARY OF THE DISCLOSURE

Methods of manufacturing a flash memory cells are disclosed wherein a device of a smaller size can be obtained while the coupling ratio of a floating gate is maximized. In the disclosed methods, a trench insulating film is etched by controlling the wall sacrificial oxidization process. Also, a wall oxidization process and a cleaning process for the trench insulating film are performed before and after the process of forming the trench insulating film.

One disclosed method of manufacturing a flash memory cell comprises forming a pad oxide film and a pad nitride film on a semiconductor substrate; forming a trench in the semiconductor substrate; forming a trench insulating film on the entire structure and then implementing a first chemical mechanical polishing (CMP) process to isolate the trench insulating film; removing the pad nitride film, by which a given portion of the trench insulating film is protruded; performing an etch process to etch the protrusion of the trench insulating film a given width; forming a first polysilicon layer on the entire structure and then implementing a second CMP process to form a floating gate; and forming a dielectric film and a second polysilicon layer on the entire structure and then implementing an etch process to form a control gate.

BRIEF DESCRIPTION OF THE DRAWINGS

The aforementioned aspects and other features of the disclosed methods will be explained in the following description, taken in conjunction with the accompanying drawings, wherein.

DETAILED DESCRIPTION OF THE PRESENTLY PREFERRED EMBODIMENTS

FIG. 1A through FIG. 1L are cross-sectional views of a flash memory cell for describing a method of manufacturing a flash memory cell according to a preferred embodiment.

Figure 1A:
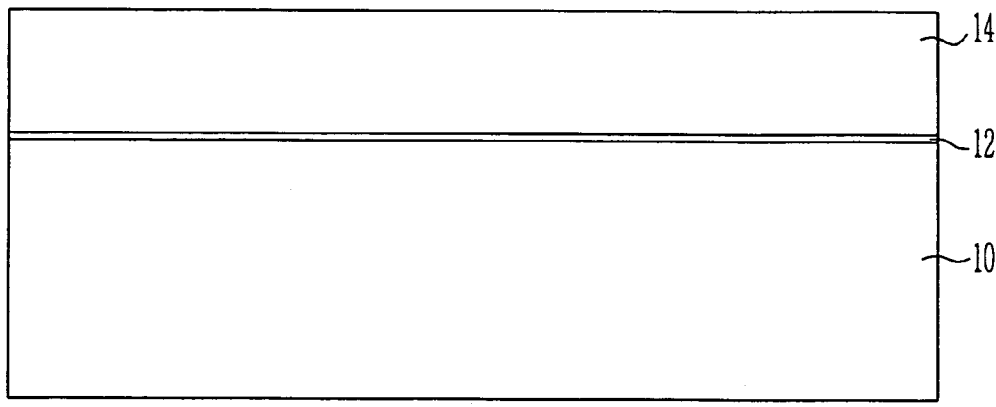
FIG. 1A through FIG. 1L are cross-sectional views of a flash memory cell for describing a method of manufacturing a flash memory cell according to one preferred embodiment.

Referring now to FIG. 1A, a pad oxide film 12 and a pad nitride film 14 are sequentially formed on a semiconductor substrate 10.

At this time, the pad oxide film 12 is formed in thickness of 70 through 200 Å by dry or wet oxidization process at a temperature ranging from about 700 to about 950° C. in order to prohibit crystal defects on the surface of the semiconductor substrate 10 or mitigate stress of the pad nitride film 14 to be formed in a surface processing or subsequent process. Further, the pad nitride film 14 is formed to be relatively thick, i.e., from about 2000 to about 3500 Å, by means of a LP-CVD method.

Figure 1B:
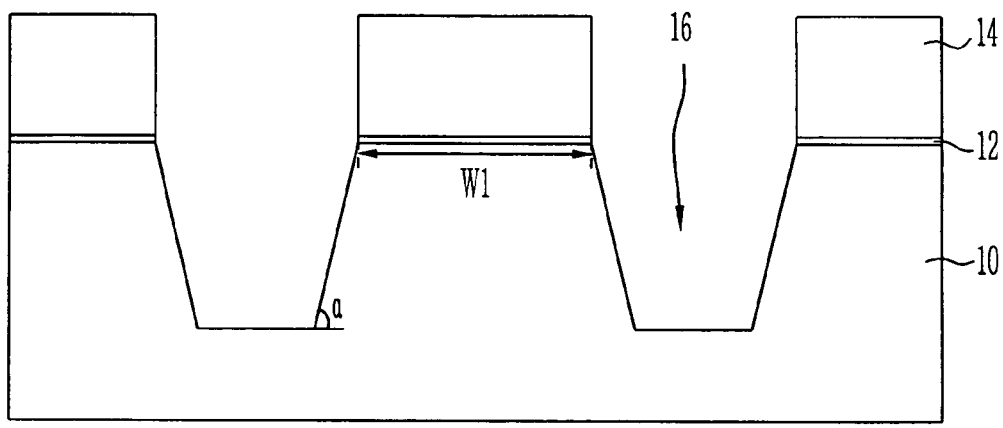

Referring now to FIG. 1B, a STI process using an isolation (ISO) mask is performed to etch a given portion of the semiconductor substrate 10 including the pad nitride film 14 and the pad oxide film 12. Thus, a trench 16 is formed by which a given portion of the semiconductor substrate 10 is sunken. The semiconductor substrate 10 is divided into an active region and an inactive region (i.e., region in which the trench is formed) by the trench 16. The active region has a critical dimension (CD) of a 'W1' size, as shown.

At this time, an internal surface of the trench 16 has a tilt angle (a) ranging from about 60 to about 85°. The pad nitride film 14 has an almost vertical profile, considering the inclination of a first polysilicon layer for a floating gate that will be formed in a subsequent process and a etch margin subsequent etch process.

Figure 1C:
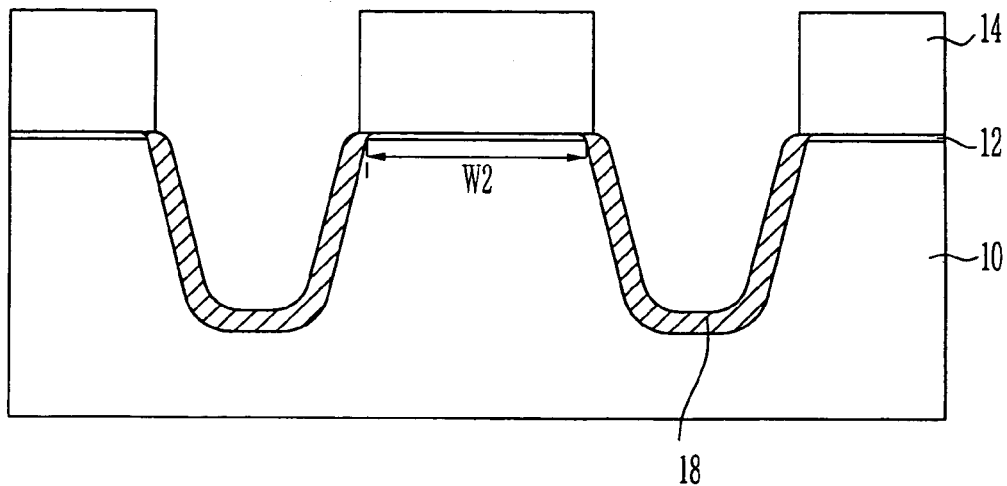

Referring now to FIG. 1C, a wall sacrificial (SAC) oxidization process of a dry or wet oxidization method is performed to oxidize silicon on the internal surface of the trench 16, thus forming a sacrifice oxide film 18.

At this time, the wall sacrificial oxidization process is performed by means of dry or wet oxidization method at a temperature ranging from about 700 to about 1000° C. in order to compensate for etch damage on the internal surface of the trench 16, make rounded an edge portion of the top portion of the trench 16 (i.e., portion contacting the pad oxide film) and obtain overlapping between a trench insulating film (i.e., field oxide film) and a floating gate that are to be formed in a subsequent process. At this time, the wall sacrificial oxidization process includes controlling an oxidation time in order to optimize the thickness of the sacrifice oxide film 18.

In other words, in order to obtain the overlapping between the trench insulating film and the floating gate by maximum, it is required that the thickness of the sacrifice oxide film 18 ranges from about 150 to about 300 Å. For this, the wall sacrificial oxidization process includes setting the thickness of a deposition target ranges from about 150 Å to about 300 Å. Due to this, the sacrifice oxide film 18 has a thickness ranging from about 150 to about 300 Å and the active region has a critical dimension (CD) of 'W2' (W2<W1).

Meanwhile, if the overlapping between the trench insulating film and the floating gate is not considered, the sacrifice oxide film 18 is formed with a thickness ranging from about 70 to about 150 Å in thickness by controlling a deposition target of the wall sacrificial oxidization process.

Figure 1D:
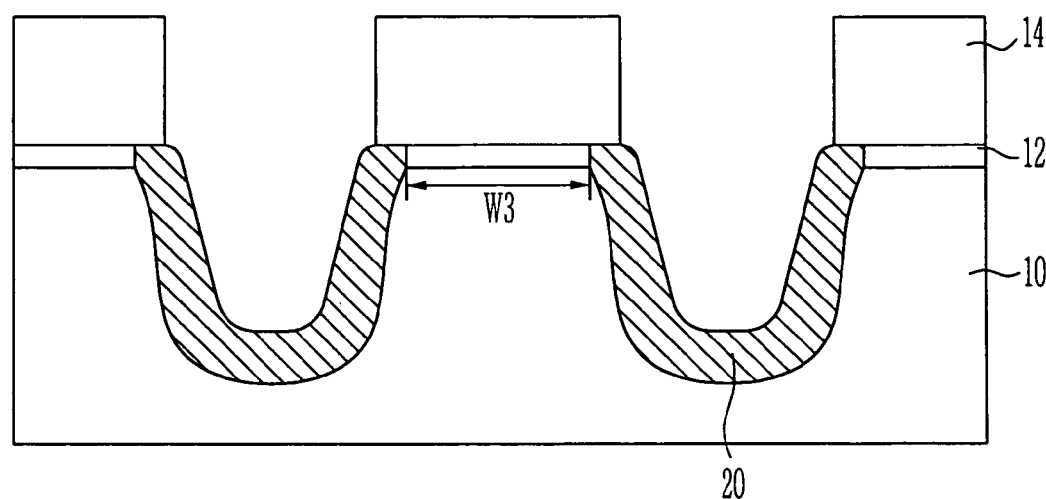

Referring now to FIG. 1D, the sacrifice oxide film 18 is removed by performing a cleaning process using the thickness of the sacrifice oxide film 18 as a target. Next, a wall oxidization process is performed to form a wall oxide film 20.

At this time, the wall oxidization process is performed using a deposition target ranging from about 300 to about 600 Å in thickness and a wet oxidization method at a temperature ranging from about 800 to about 1000° C. in order to compensate for etch damage on the internal surface of the trench 16 and obtain overlapping of 40 through 70% (i.e., 300 through 700 Å) between the trench insulating film and the floating gate. Due to this, the wall oxide film 20 has a thickness ranging from about 300 to about 600 Å and the active region has a critical dimension (CD) of 'W3' (W3<W2).

Meanwhile, the cleaning process for removing the sacrifice oxide film 18 is performed considering the overlapping between the trench insulating film and the floating gate. Generally, the cleaning process is performed using a solution in which diluted HF (DHF, HF solution in which $H_2O$ is diluted at the ratio of about 50:1) or buffer oxide etchant (BOE, solution in which HF and $NH_4F$ are mixed at the ratio ranging from about 100:1 to about 300:1) and SC-1 in which $NH_4OH/H_2O_2/H_2O$ solutions are mixed at a given ratio). Further, if not considering the overlapping between the trench insulating film and the floating gate, the wall oxide film 20 is formed to have a thickness ranging from about 100 to about 200 Å by adjusting a deposition target of the wall oxidization process.

Figure 1E:
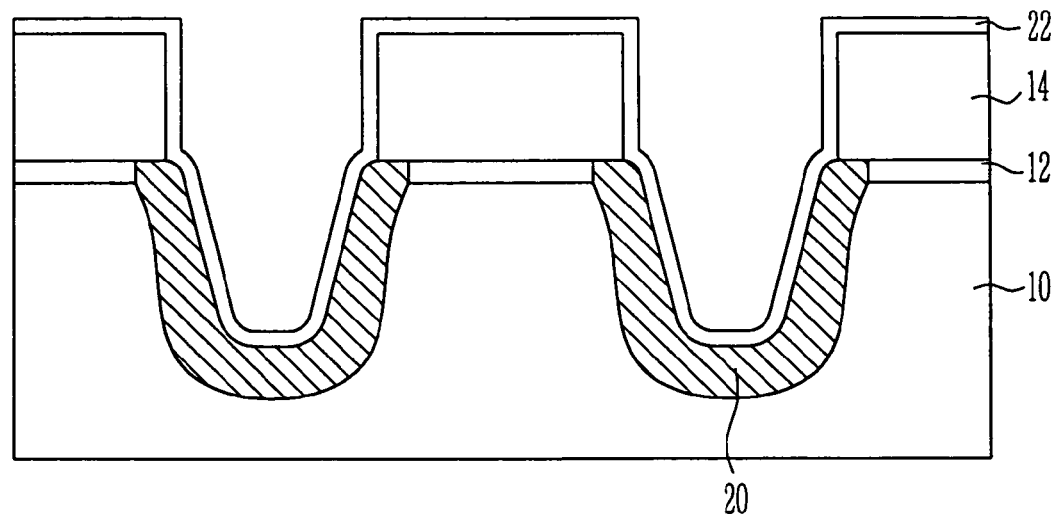

Referring now to FIG. 1E, a high temperature oxide (HTO) using DCS ($SiH_2Cl_2$) as a basic source gas is thinly deposited on the entire structure. A fineness process is then performed at a high temperature, thus forming a liner oxide film 22 having a thickness ranging from about 50 to about 500 Å.

At this time, the fineness process is performed under $N_2$ atmosphere at a high temperature ranging from about 900 to about 1100° C. for a time period ranging from about 20 to about 30 minutes. As the etch resistance is thus increased due to fine texture of the liner oxide film 22, it is possible to prevent formation of a moat generating upon a STI process and a leakage current. At this time, the fineness process for making fine the texture of the liner oxide film 22 may be performed after a subsequent trench insulating film is formed.

Figure 1F:
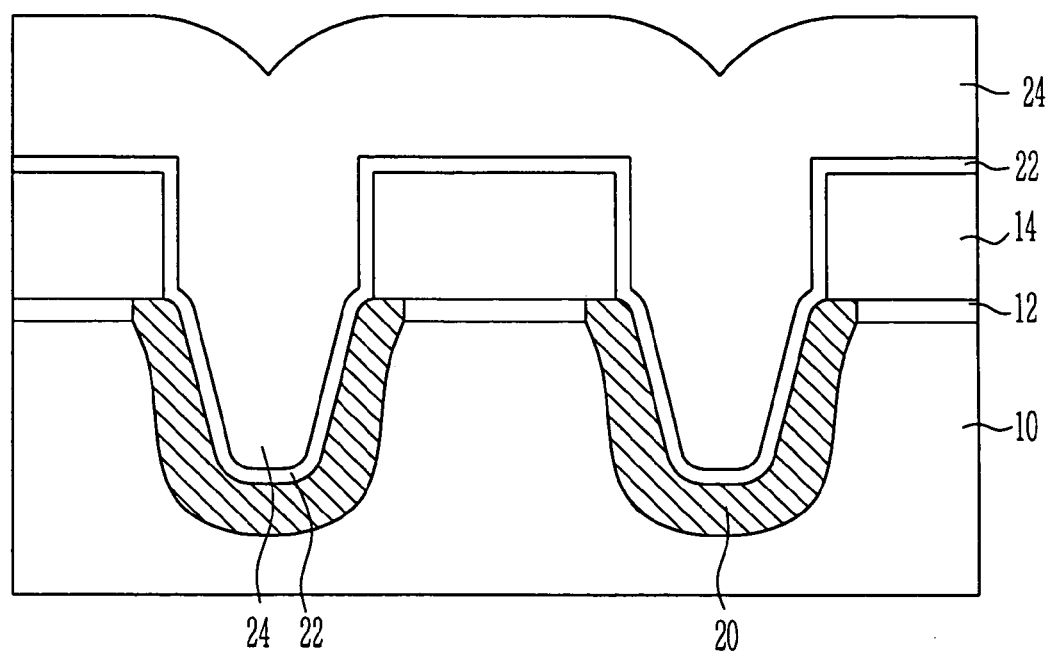

Referring now to FIG. 1F, a deposition process using a high-density plasma (HDP) oxide film is performed for the entire structure in order to bury the trench 16.

A trench insulating film 24 is thus formed to have a thickness ranging from about 4000 to about 10000 Å. At this time, the deposition process for depositing the trench insulating film 24 is performed using a gap filling method so that void does not occur on the internal surface of the trench 16.

Figure 1G:
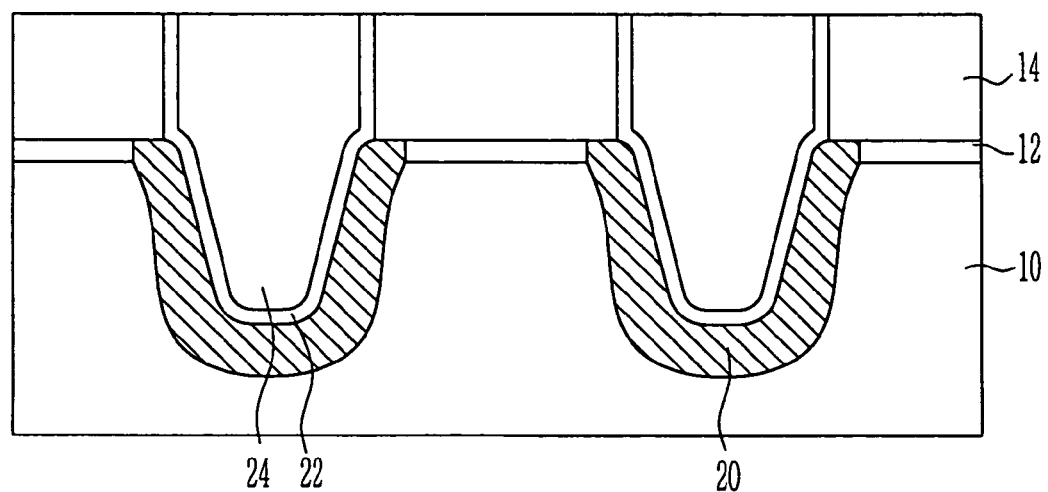

Referring to FIG. 1G, a chemical mechanical polishing (CMP) process is performed for the entire structure using the pad nitride film 14 as an etch stop layer in order to polish the trench insulating film 24. The trench insulating film 24 is thus isolated cross the pad nitride film 14. At this time, the CMP process is performed so that the pad nitride film 14 is not over etched.

Next, a cleaning process is performed in order to remove a HDP oxide film remaining on the surface of the pad nitride film 14. At this time, the cleaning process is controlled so that reduction in the height H of the trench insulating film 24 can be minimized not to over etch the trench insulating film 24.

Figure 1H:
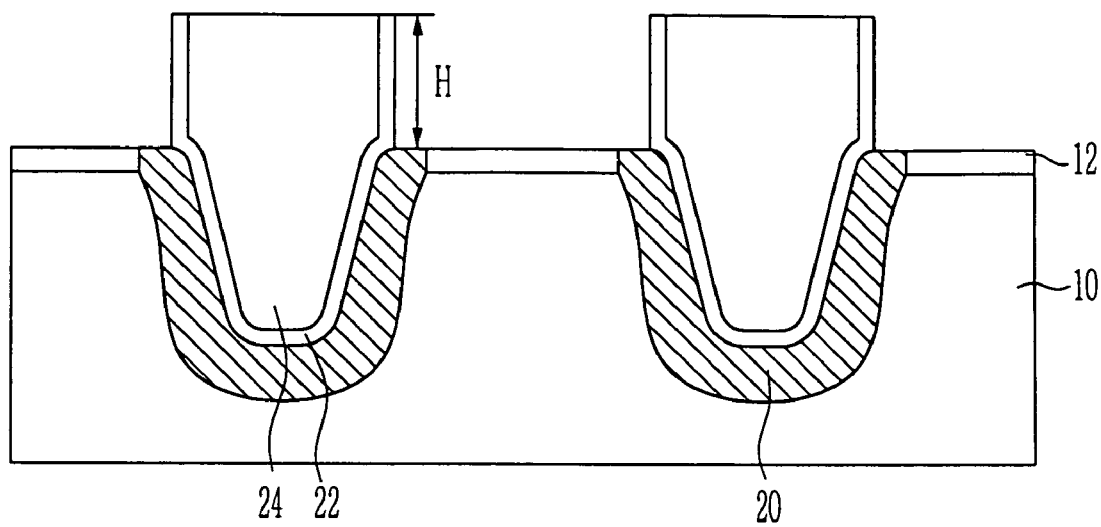

By reference to FIG. 1H, a strip process using the pad oxide film 12 as an etch stop layer is performed for the entire structure using $H_3PO_4$ (phosphoric acid) to remove the pad nitride film 14. The trench insulating film 24 with an upwardly protruding structure is thus formed. At this time, the strip process is performed so that the height H of the trench insulating film 24 ranges from about 1500 to about 3000 Å from the upper surface of the pad oxide film 24.

Figure 1I:
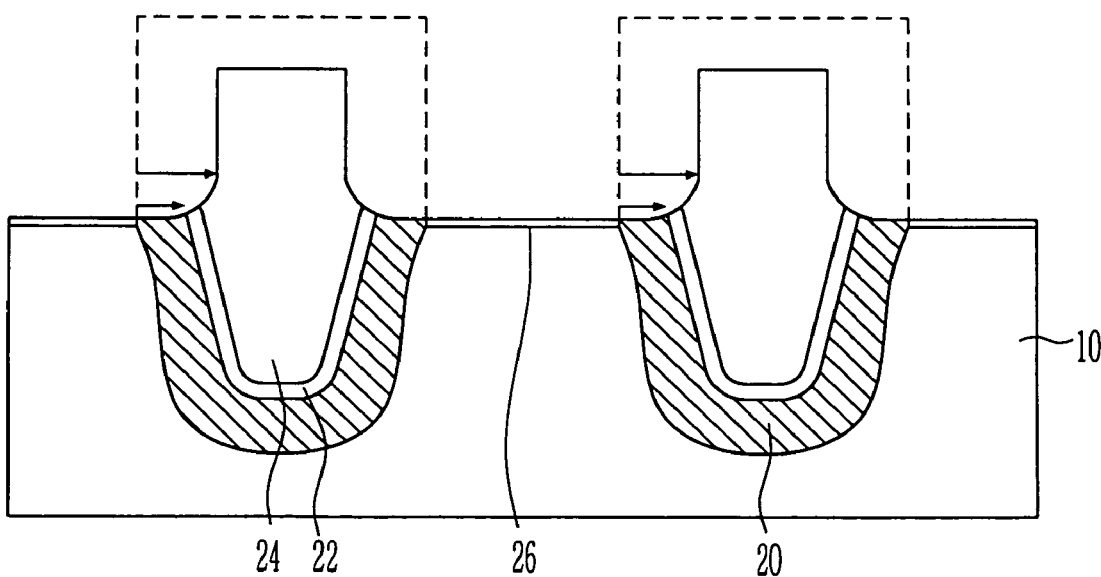

Referring now to FIG. 1I, a cleaning process using the semiconductor substrate 10 as an etch stop layer is performed for the entire structure using HF dip out. Due to this, the pad oxide film 12 is removed and the protrusion of the trench insulating film 24 is also etched to have a given width of a nipple shape. At this time, the cleaning process includes dipping the semiconductor substrate 10 into a container containing DHF or BOE, cleaning the semiconductor substrate 10 using DI water, dipping the semiconductor substrate 10 into a container containing SC-1 in order to remove a particle, cleaning the semiconductor substrate 10 using DI water and then drying the semiconductor substrate 10.

Further, the cleaning process includes controlling a dip time, that is, a wet time. In the present invention, however, the cleaning process includes setting the deposition thickness of the pad oxide film 12 to an etch thickness. Upon the cleaning process, therefore, the trench insulating film 24 is etched to have a desired thickness. It is thus possible to prevent generation of a moat in the trench insulating film 24 and to minimize a spacing of a floating gate in a subsequent process. In other words, the wall oxide film 20 formed by the wall oxidization process and the liner oxide film 22 made fine by the high-temperature fineness process have a lower etching rate against HF being a cleaning solution than that of the trench insulating film 24. It is thus possible to prevent generation of a moat in the trench insulating film 24 and to etch the trench insulating film 24 by a desired thickness.

Meanwhile, if the pre-process for forming the sacrifice oxide film 18 and the wall oxide film 20 is performed considering the overlapping region of the floating gate and the trench insulating film 24, a cleaning process by which the size of the overlapping region of the floating gate and the trench insulating film 24 has a thickness ranging from about 100 to about 300 Å (or 20 through 30%) is performed. On the contrary, if the pre-process is performed without considering the overlapping region of the floating gate and the trench insulating film 24 in the sacrifice oxide film 18 and the wall oxide film 20, the cleaning process by which the size of the overlapping region of the floating gate and the trench insulating film 24 has a thickness ranging from about 400 to about 600 Å in thickness is performed.

In other words, it is possible to control the coupling ratio of the floating gate by adjusting the wall sacrificial oxidization process, the wall oxidization process and the cleaning process for etching the trench insulating film 24 to a given width. In the present invention, however, the coupling ratio of the floating gate is firstly controlled in the wall sacrificial oxidization process and the wall oxidization process. The coupling ratio of the floating gate is then controlled in the cleaning process of the trench insulating film 24 or the coupling ratio of the floating gate is controlled in the cleaning process for etching the trench insulating film 24 after the wall sacrificial oxidization process and the wall oxidization process are performed as a common process. In other words, in the wall sacrificial oxidization process and the wall oxidization process, the critical dimension (CD) of the active region can be reduced to a given width by adjusting an oxidization time. In the cleaning process of the trench insulating film 24, the size of a nipple of the trench insulating film 24 can be controlled by adjusting a dip time.

Thereafter, a screen oxidation process is performed for the active region for the purpose of an ion implantation process for forming a well and an ion implantation process for controlling a threshold voltage. A screen oxide film 26 is thus formed. Next, the ion implantation process for forming a well and the ion implantation process for controlling a threshold voltage are performed to form a well region and an impurity region (not shown) at the active region of the semiconductor substrate 10. At this time, as the screen oxidization process is performed using wet or dry oxidization method at a temperature ranging from 750 to 900° C., the screen oxide film 26 is formed to have a thickness of 30 through 100 Å.

Figure 1J:
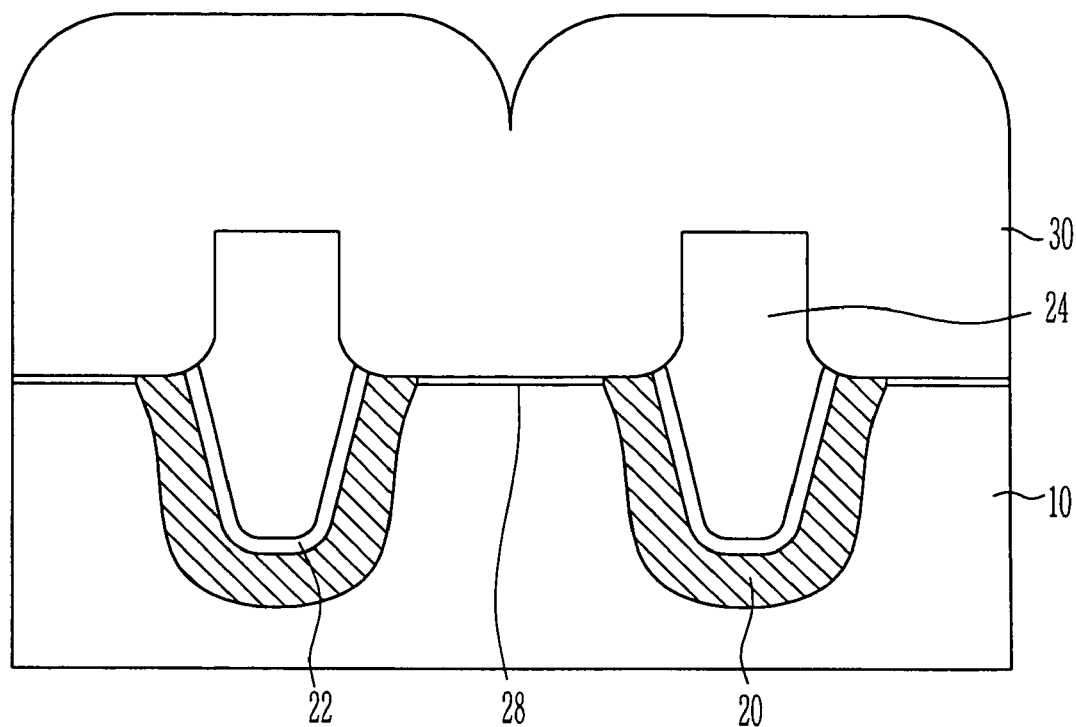

Referring now to FIG. 1J, the screen oxide film 26 is removed by a cleaning process. A tunnel oxide film 28 is then formed at a portion from which the screen oxide film 26 is removed. At this time, the tunnel oxide film 28 is formed by performing a wet oxidization process at a temperature ranging from about 750 to about 800° C. and then performing an annealing process using $N_2$ at a temperature ranging from about 900 to about 910° C. for a time period ranging from about 20 to about 30 minutes. It is thus possible to minimize interfacial defect density with the semiconductor substrate 10.

Further, the cleaning process for removing the screen oxide film 26 is performed using DHF or BOE solution and SC-1. At this time, the cleaning process is performed by adjusting the dip time. Thus, the size of the nipple of the trench insulating film 24 ranges from about 0.05 to about 0.15 μm. Further, the overlapping region of the floating gate and the trench insulating film 24 has a thickness ranging from about 600 to about 800 Å or is increased by about 100 to about 300 Å in thickness more than the overlapping region by the pre-process (cleaning process of the trench insulating film).

Meanwhile, another cleaning process other than the cleaning process for removing the screen oxide film 26 may be performed. Thus, the overlapping region of the floating gate and the trench insulating film 24 has a thickness ranging from about 600 to about 1000 Å.

Next, in order to prevent concentration of an electric field due to minimized grain size, a deposition process is performed for the entire structure using a LP-CVD method at a temperature ranging from about 580 to about 620° C. at a pressure ranging from about 0.1 to about 3 Torr under a gas atmosphere of $SiH_4$ or $Si_2H_6$ and $PH_3$. Thus, a first polysilicon layer 30 for the floating gate is formed.

Figure 1K:
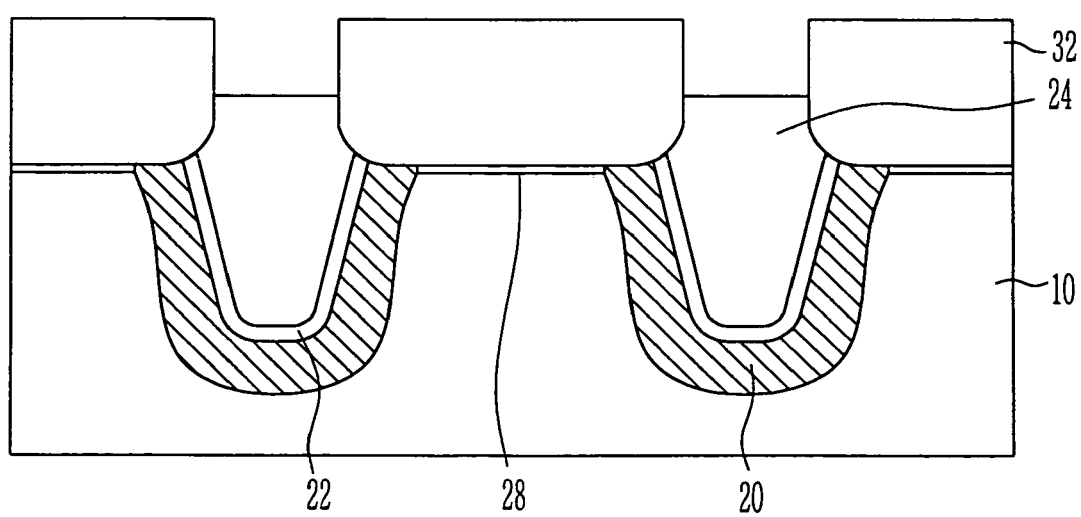

Referring now to FIG. 1K, a CMP process is performed for the entire structure using the nipple of the trench insulating film 24 as an etch stop layer in order to polish the first polysilicon layer 30. The first polysilicon layer 30 is thus isolated cross the protrusion of the trench insulating film 24 to form a floating gate 32. At this time, the floating gate 32 is uniformly formed in thickness ranging from about 700 to about 1200 Å.

Thereafter, a cleaning process is performed to etch the nipple of the trench insulating film 24 that protrudes between the floating gates 32 to a desired target. The surface area of the floating gate 32 is thus secured to significantly increase the coupling ratio.

Figure 1L:
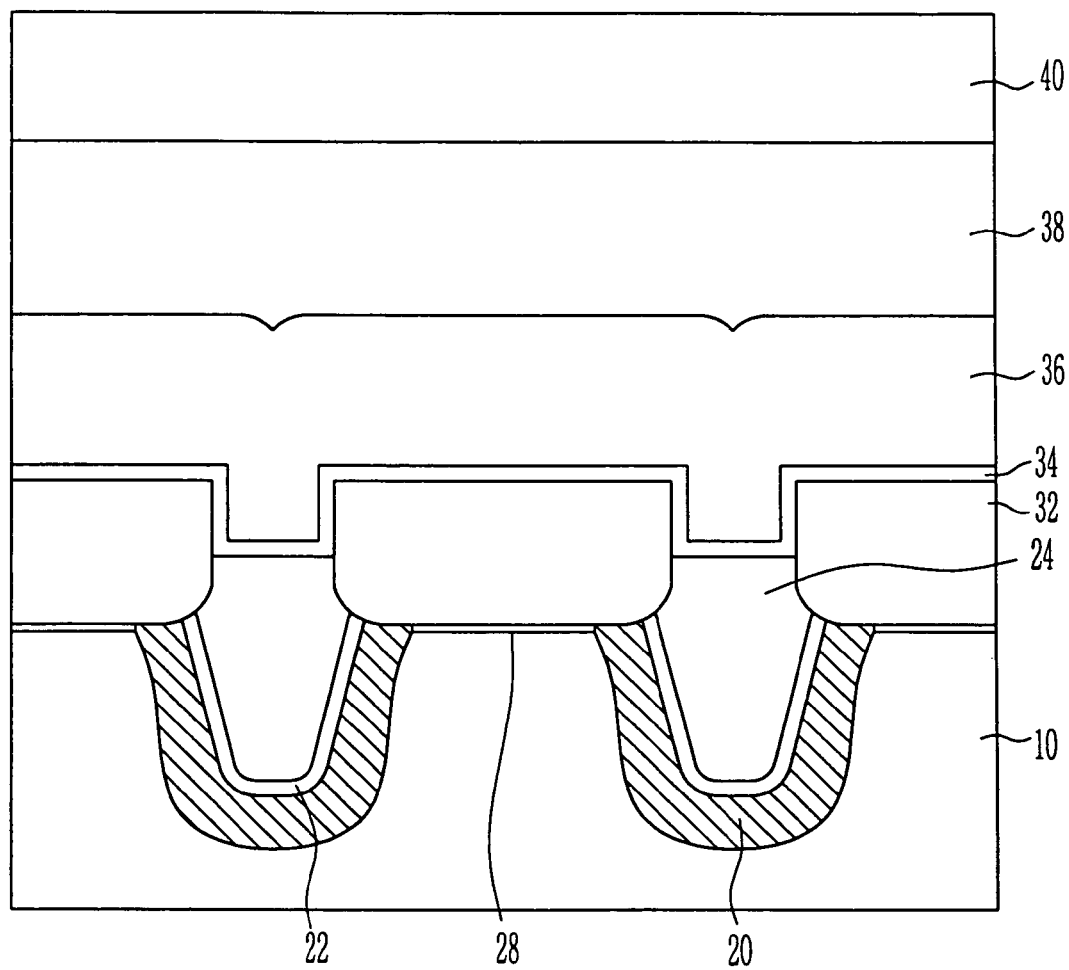

By reference to FIG. 1L, a dielectric film 34 of an oxide/nitride/oxide (ONO) structure or an oxide/nitride/oxide/nitride (ONON) structure is formed on the entire structure. At this time, in case of the ONO structure, oxide films on an upper side and a lower side of the dielectric film 34 are formed with a thickness ranging from about 35 to about 80 Å using HTO in which DCS ($SiH_2Cl_2$) gas having a good internal partial pressure and a good time dependent dielectric breakdown (TDDB) characteristic and $N_2O$ gas are used as a source gas. At this time, the oxide film is formed by a LP-CVD method. At this time, the LP-CVD method includes loading the semiconductor substrate 10 at a temperature ranging from about 600 to about 700° C. and at a temperature ranging from about 810 to about 850° C. and under a low pressure ranging from about 0.1 to about 3 Torr. Also, a nitride film formed between a lower side and an upper side of the dielectric film 34 is formed with a thickness ranging from about 35 to about 80 Å using $NH_3$ and DCS as a reaction gas. At this time, the nitride film is formed by the LP-CVD method at a temperature ranging from about 650 to about 800° C. at a low pressure ranging from about 1 to about 3 Torr.

Next, an annealing process is performed in order to improve the quality of the dielectric film 34 and strengthen the interface of the layers on the semiconductor substrate 10. At this time, the annealing process is performed using a wet oxidization method. The dielectric film 34 is thus oxidized to a thickness ranging from about 150 to about 300 Å based on a bare Si wafer, that is, a monitoring wafer. At this time, the dielectric film formation and annealing processes are so performed that they comply with a device characteristic. These processes are performed with almost no time delay in order to prevent a native oxide film or impurity contamination among the layers.

Thereafter, a second polysilicon layer 36, a metal layer 38 and a hard mask 40 are sequentially formed on the entire structure. At this time, the second polysilicon layer 36 is formed with a thickness ranging from about 700 to about 2000 Å using a silicon layer deposited by a LP-CVD method. Also, the metal layer 38 is formed with a thickness ranging from about 500 to about 1000 Å using tungsten.

As mentioned above, a wall sacrificial oxidization process, a wall oxidization process and a cleaning process of a trench insulating film, which are performed before/after a process of forming the trench insulating film gap filled in order to bury a trench are performed to etch a trench insulating film to a desired space. Therefore, the disclosed method includes the advantage that the coupling ratio of a floating gate can be secured and a device of a smaller size can be obtained.

Further, a uniform floating gate is formed without using conventional mask and etch processes. Therefore, it is possible to reduce the irregularities device resulting from variations of the mask critical dimension.

Also, only an ISO mask process is required as a mask process until a floating gate formation process is performed. Thus, it is possible to improve the yield of a device and reduce the cost by significantly simplifying the process compared to a conventional process including three mask processes; an ISO mask, a key mask and a mask for a floating gate.

Incidentally, variation in the coupling ratio can be minimized since a uniform floating gate is formed. Due to this, the disclosed method can improve the device characteristics.

In addition, the disclosed method can be easily applied to implementation of a next-generation high-integration flash memory cell. Further, various process margins can be obtained by controlling the height of the trench insulating film and the dip time of a cleaning process. Therefore, it is possible to form a device with low cost and high reliability using conventional equipment and process without using additional complex processes and high-cost equipments.

The disclosed method has been described with reference to a particular embodiment in connection with a particular application. Those having ordinary skill in the art and access to the teachings of this disclosure will recognize additional modifications and applications within the scope thereof.

It is therefore intended by the appended claims to cover any and all such applications, modifications, and embodiments within the spirit and scope of the present invention.

What is claimed is:

1. A method of manufacturing a flash memory cell comprising:
    forming a pad oxide film and a pad nitride film on a semiconductor substrate;
    forming a trench in the semiconductor substrate;
    forming a trench insulating film on an entire structure including the trench and then implementing a first chemical mechanical polishing (CMP) process to isolate the trench insulating film;
    removing the pad nitride film, by which a given portion of the trench insulating film forms a protrusion;
    performing an etch process to etch the protrusion of the trench insulating film a given width;
    forming a screen oxide film having a thickness ranging from about 30 Å to about 100 Å on an active region of the semiconductor substrate;
    implementing an ion implantation process for forming a well and an ion implantation process for controlling a threshold voltage on the semiconductor substrate to form a well region and an impurity region;
    implementing an etch process to remove the screen oxide film;
    implementing a wet oxidization process on the active region at a temperature ranging from about 750° C. to about 800° C. and then implementing an annealing process to form a tunnel oxide film;
    forming a first polysilicon layer on the entire structure and then implementing a second CMP process to form a floating gate; and
    forming a dielectric film and a second polysilicon layer on the entire structure and then implementing an etch process to form a control gate.

2. The method as claimed in claim 1, comprising forming the pad oxide film with a thickness ranging from about 70 Å to about 200 Å by dry or wet oxidization process at a temperature ranging from about 700° C. to about 950° C. for the purpose of crystal defect processing on the surface of the semiconductor substrate or the surface processing.

3. The method as claimed in claim 1, comprising forming the pad nitride film with a thickness ranging from about 2000 Å to about 3500 Å by a LP-CVD method.

4. The method as claimed in claim 1, wherein an internal inclination surface of the trench has a tilt angle ranging from about 60° C. to about 85° C.

5. The method as claimed in claim 1, further comprising the step of forming the trench insulating film and then performing a fineness process under $N_2$ atmosphere at a high temperature ranging from about 900° C. to about 1100° C. for a time period ranging from about 20 minutes to about 30 minutes.

6. The method as claimed in claim 1, comprising performing the first CMP process using the pad nitride film as an etch barrier layer.

7. The method as claimed in claim 1, wherein the protrusion of the trench insulating film has the height from the pad oxide file ranging from about 1500 Å to about 3000 Å.

8. The method as claimed in claim 1, comprising removing the pad nitride film by an etch process using $H_3PO_4$.

9. The method as claimed in claim 1, comprising performing the etch process for etching the protrusion of the trench insulating film by means of a cleaning process using DHF or BOE and SC-1 by controlling a dip time so that an overlapping region of the trench insulating film and the floating gate has a thickness ranging from about 100 Å to about 300 Å.

10. The method as claimed in claim 1, comprising performing the etch process for etching the protrusion of the trench insulating film by means of a cleaning process using DHF or BOE and SC-1 by controlling a dip time so that an overlapping region of the trench insulating film and the floating gate has a thickness ranging from about 400 Å to about 600 Å in thickness.

11. The method as claimed in claim 1, comprising performing the etch process for removing the screen oxide film by means of a cleaning process using DHF or BOE and SC-1 by controlling a dip time so that a size of the protrusion of the trench insulating film ranges from about 0.05 $\mu$m to about 0.15 $\mu$m.

12. The method as claimed in claim 1, comprising performing the etch process for removing the screen oxide film by means of a cleaning process using DHF or BOE and SC-1 by controlling a dip time so that an overlapping region of the trench insulating film and the floating gate has a thickness ranging from about 600 Å to about 800 Å.

13. The method as claimed in claim 1, comprising performing the annealing process using $N_2$ at a temperature ranging from about 900° C. to about 910° C. for a time period ranging from about 20 minutes to about 30 minutes in order to minimize an interfacial defect density with the semiconductor substrate.

14. The method as claimed in claim 1, further comprising the step of performing a cleaning process for controlling a thickness overlapping region of the floating gate and the trench insulating film to range from 600 Å to about 1000 Å after the process of forming the tunnel oxide film is performed.

15. The method as claimed in claim 1, comprising forming the first polysilicon layer in a thickness ranging from about 800 Å to about 2000 Å by a LP-CVD method.

16. The method as claimed in claim 1, wherein the second CMP process includes polishing a given portion of the first polysilicon layer using the protrusion of the trench insulating film as an etch stop layer in order to expose the protrusion of the trench insulating film.

17. The method as claimed in claim 1, comprising uniformly forming the floating gate in a thickness ranging from about 700 Å to about 1200 Å.

18. The method as claimed in claim 1, comprising forming the dielectric film to have an oxide/nitride/oxide (ONO) structure or an oxide/nitride/oxide/nitride structure.

19. The method as claimed in claim 18, wherein the ONO comprises:
    a first oxide film that is formed in a thickness ranging from about 35 Å to about 60 Å using HTO using DCS($SiH_2Cl_2$) and $N_2O$ gas as a source gas;
    a nitride film that is formed in a thickness ranging from about 50 Å to about 65 Å on the first oxide film by means of a LP-CVD method using $NH_3$ and DCS gas as a reaction gas at a temperature ranging from about 650 Å to about 800 Å under a low pressure ranging from about 1 Torr to about 3 Torr; and a second oxide film that is formed in a thickness ranging from about 35 Å to about 60 Å on the nitride film using HTO using $DCS(SiH_2Cl_2)$ and $N_2O$ gas as a source gas.

20. The method as claimed in claim 1, comprising oxidizing the dielectric film to a thickness ranging from about 150 Å to about 300 Å based on bare silicon.

21. The method as claimed in claim 1, wherein the second polysilicon layer has a doped layer having a thickness ranging from about 700 Å to about 2000 Å.

22. The method as claimed in claim 1, further comprising the step of forming a tungsten layer having a thickness ranging from about 500 Å to about 1000 Å on the entire structure after the second polysilicon layer is formed.

* * * * *